(12) United States Patent
Olsen et al.

(10) Patent No.: US 12,521,270 B2
(45) Date of Patent: Jan. 13, 2026

(54) MEDICAL APPLIANCE

(71) Applicant: Coloplast A/S, Humlebaek (DK)

(72) Inventors: Jesper Kenneth Olsen, Birkeroed (DK); Kamilla Grove Sund, Alleroed (DK)

(73) Assignee: Coloplast A/S, Humlebaek (DK)

( * ) Notice: Subject to any disclaimer, the term of this patent is extended or adjusted under 35 U.S.C. 154(b) by 489 days.

(21) Appl. No.: 18/028,786

(22) PCT Filed: Sep. 28, 2021

(86) PCT No.: PCT/DK2021/050301
§ 371 (c)(1),
(2) Date: Mar. 28, 2023

(87) PCT Pub. No.: WO2022/063379
PCT Pub. Date: Mar. 31, 2022

(65) Prior Publication Data
US 2023/0329893 A1    Oct. 19, 2023

(30) Foreign Application Priority Data

Sep. 28, 2020    (DK) .......................... PA 2020 70653

(51) Int. Cl.
*A61F 5/44* (2006.01)
*A61F 5/443* (2006.01)
(52) U.S. Cl.
CPC ............ *A61F 5/4404* (2013.01); *A61F 5/443* (2013.01)

(58) Field of Classification Search
CPC .. A61F 5/4404; A61F 5/443; A61F 13/00051; A61F 5/445
See application file for complete search history.

(56) References Cited

U.S. PATENT DOCUMENTS 6,071,304 A * 6/2000 Augustine ......... A61F 13/00051
602/14
7,892,217 B2    2/2011 Boiarski
(Continued)

FOREIGN PATENT DOCUMENTS

EP    0341235 A2    11/1989
WO    2008073718 A2    6/2008
(Continued)

*Primary Examiner* — Susan S Su
*Assistant Examiner* — Erin A Kim
(74) *Attorney, Agent, or Firm* — Coloplast Corp., Coloplast A/S; Nick Baumann

(57) ABSTRACT

A medical appliance (100) being substantially planar and extending in an appliance plane. The medical appliance comprises a first area (111) and a second area (112) in the appliance plane, the medical appliance having a first Young's modulus in the first area and a second Young's modulus in the second area being greater than the first Young's modulus. The medical appliance comprises one or more conductive traces (121) extending in the appliance plane from within the first area to within the second area. The conductive trace has a first part (121a) within the first area and a second part (121b) within the second area, and the conductive trace has an intermediate part (121c) between the first part and the second part. The electrical resistance of the primary intermediate part (R3) is lower than the electrical resistance of the primary first part (R1) and lower than the electrical resistance of the primary second part (R2).

20 Claims, 6 Drawing Sheets

(56) References Cited

U.S. PATENT DOCUMENTS

| | | |
|---|---|---|
| 2012/0052268 A1 | 3/2012 | Axisa et al. |
| 2019/0133811 A1 | 5/2019 | Seres et al. |
| 2019/0133812 A1* | 5/2019 | Seres ..................... A61F 5/443 |
| 2020/0246174 A1 | 8/2020 | Hansen et al. |

FOREIGN PATENT DOCUMENTS

| | | | |
|---|---|---|---|
| WO | 2014130931 A1 | 8/2014 | |
| WO | 2018189265 A1 | 10/2018 | |
| WO | 2019063488 A2 | 4/2019 | |
| WO | 2019120443 A1 | 6/2019 | |
| WO | WO-2019120451 A1 * | 6/2019 | ............... A61F 5/44 |

* cited by examiner

MEDICAL APPLIANCE

The present disclosure relates to a medical appliance having one or more conductive traces arranged in a first area and a second area having different Young's moduli.

BRIEF DESCRIPTION OF THE DRAWINGS

The accompanying drawings are included to provide a further understanding of embodiments and are incorporated into and a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
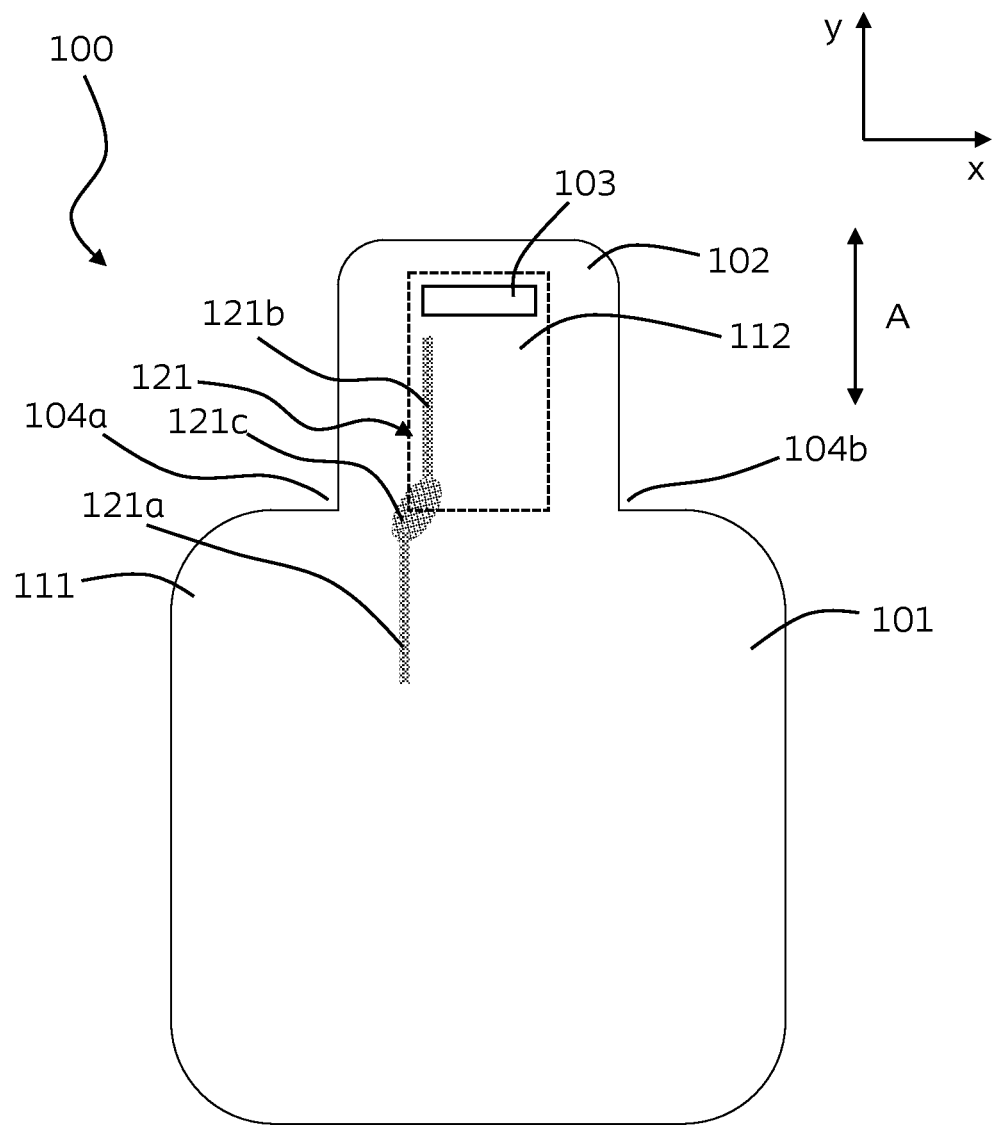
FIG. 1 illustrates a medical appliance according to an embodiment of the invention.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Throughout this disclosure, the words "stoma" and "ostomy" are used to denote a surgically created opening bypassing the intestines or urinary tract system of a person. The words are used interchangeably, and no differentiated meaning is intended. The same applies for any words or phrases derived from these, e.g. "stomal", "ostomies" etc. Also, the solid and liquid wastes emanating from the stoma may be referred to as both stomal "output," "waste(s)," "liquids," and "fluids" interchangeably. A subject having undergone ostomy surgery may be referred to as "ostomist" or "ostomate"—moreover, also as "patient" or "user". However, in some cases "user" may also relate or refer to a health care professional (HCP), such as a surgeon or an ostomy care nurse or others. In those cases, it will either be explicitly stated, or be implicit from the context that the "user" is not the "patient" him- or herself.

In the following, whenever referring to proximal side or surface of a layer, an element, a device or part of a device, the referral is to the skin-facing side or surface, when a user wears the appliance. Likewise, whenever referring to the distal side or surface of a layer, an element, a device or part of a device, the referral is to the side or surface facing away from the skin, when a user wears the appliance. In other words, the proximal side or surface is the side or surface closest to the user, when the appliance is fitted on a user and the distal side is the opposite side or surface—the side or surface furthest away from the user in use.

The axial direction is defined as the direction of the stoma when a user wears the appliance. Thus, the axial direction is generally perpendicular to the skin or abdominal surface of the user.

A radial direction is defined as perpendicular to the axial direction. In some sentences, the words "inner" and "outer" may be used. These qualifiers should generally be perceived with respect to the radial direction, such that a reference to an "outer" element means that the element is farther away from a centre portion of the ostomy appliance than an element referenced as "inner". In addition, "innermost" should be interpreted as the portion of a component forming a centre of the component and/or being adjacent to the centre of the component. In analogy, "outermost" should be interpreted as a portion of a component forming an outer edge or outer contour of a component and/or being adjacent to that outer edge or outer contour.

The use of the word "substantially" as a qualifier to certain features or effects in this disclosure is intended to simply mean that any deviations are within tolerances that would normally be expected by the skilled person in the relevant field.

The present disclosure relates to a medical appliance, such as an ostomy appliance or a wound dressing, being adapted for attachment to the skin surface of a mammal, such as a human.

Providing sensing means, such as sensors, in a medical appliance, in particular a medical appliance being stretchable and/or flexible to accommodate attachment to a skin surface of a user, requires such sensors to accommodate/withstand possible bending or stretching. In particular, where the sensors comprise one or more electrodes, e.g. printed conductive traces on a substrate, such one or more electrodes must be resistant to rupturing caused by stretching of the substrate. In embodiments, the medical appliance is adapted for attachment to the skin surface of a mammal, such as a human. In embodiments, the medical appliance is an ostomy appliance or a wound dressing.

In embodiments, the present disclosure relates to an ostomy system and devices thereof, such as an ostomy appliance, a base plate for an ostomy appliance, a sensor patch for application to a base plate, one or more monitor devices, and optionally one or more accessory devices. Further, methods related to the ostomy system and devices thereof are disclosed. An accessory device (also referred to as an external device) can be a mobile phone or other handheld device. In embodiments, an accessory device is a personal electronic device, e.g. a wearable, such as a watch or other wrist-worn electronic device. An accessory device can be a docking station. In embodiments, the docking station is configured to electrically and/or mechanically couple the monitor device to the docking station. In embodiments, the docking station is configured for charging a battery of the monitor device and/or configured for transferring data between the monitor device and the docking station. The ostomy system can comprise a server device. In embodiments, the server device is operated and/or controlled by the ostomy appliance manufacturer and/or a service centre.

In embodiments, the present disclosure provides an ostomy system and devices thereof, such as an ostomy appliance, a base plate for an ostomy appliance, a sensor patch for application to a base plate, a sensor assembly for an ostomy appliance, e.g. a base plate or a sensor patch of an ostomy appliance, a monitor device, and optionally one or more accessory devices which either alone or together facilitate reliable determination of the nature, severity, and rapidness of leakage propagation in the interface between a skin surface and the base plate and/or moisture propagation in the adhesive material provided for attaching the base plate and/or sensor patch to the skin surface of a user. Depending on the nature of the pattern of leakage and/or moisture propagation in the adhesive, the ostomy system and devices thereof enable providing information to the user about the type of failure, and in turn enable providing an indication to the user of the severity and thus the remaining time frame for replacing the ostomy appliance without experiencing severe leakage and/or skin damage.

Determination of moisture pattern types or (angular) leakage patterns is useful in helping to reduce the risk of a user experiencing leakage from an ostomy appliance. Further, determination of moisture pattern types and classification of operating states and/or leakage patterns of the ostomy appliance is further useful in helping reduce the risk of skin damage to a user.

In embodiments, the present disclosure relates to a wound dressing system and devices thereof, such as a wound dressing, a monitor device, and optionally one or more accessory devices. Further, methods related to the wound dressing system and devices thereof are disclosed. An accessory device (also referred to as an external device) can be a mobile phone, smartphone, or other handheld device. An accessory device can be a personal electronic device, e.g. a wearable, such as a watch or other wrist-worn electronic device. In embodiments, an accessory device is a docking station. In embodiments, the docking station is configured to electrically and/or mechanically couple the monitor device to the docking station. In embodiments, the docking station is configured for charging the monitor device and/or configured for transferring data between the monitor device and the docking station. In embodiments, the wound dressing system comprises a server device. The server device can be operated and/or controlled by the wound dressing system manufacturer and/or a service centre.

In embodiments, the present disclosure provides a wound dressing system and devices thereof, such as a wound dressing, a monitor device, and optionally one or more accessory devices which either alone or together facilitate reliable monitoring of the wound dressing and operating state thereof. Accordingly, the wound dressing system and devices thereof enable providing information to the user about the operating state (such as specific or different exudate uptake patterns, and/or exudate uptake rates) of the wound dressing, and in turn optionally enable providing an indication to the user or a caretaker of the remaining time frame for replacing the wound dressing, such as to provide optimum wound healing conditions.

In embodiments of the medical appliance being an ostomy appliance, the ostomy appliance may comprise a base plate and an ostomy pouch (also referred to as an ostomy bag). The ostomy appliance can be a colostomy appliance, an ileostomy appliance, or a urostomy appliance. In embodiments, the ostomy appliance is a two-part ostomy appliance, i.e. the base plate and the ostomy pouch are releasably coupled, e.g. with a mechanical and/or an adhesive coupling, e.g. to allow that a plurality of ostomy pouches can be utilized (exchanged) with one base plate. Further, a two-part ostomy appliance can facilitate correct application of the base plate to skin, e.g. to an improved user sight of the stomal region. In embodiments, the ostomy appliance is a one-part ostomy appliance, i.e. the base plate and the ostomy pouch are fixedly attached to each other. The base plate is configured for coupling to a user's stoma and/or skin surrounding the stoma, such as a peristomal skin area.

In embodiments, the ostomy appliance includes a base plate, such as a monolithic, one-piece base plate, e.g. integrated with a sensor assembly, or a separate sensor assembly part, such as a sensor assembly part to be subsequently applied to a base plate. In embodiments, the sensor assembly comprises at least the one or more conductive traces according to the present disclosure. In embodiments, the sensor assembly part is a sensor patch for application to the base plate, such as the proximal surface of the base plate. Thereby, an arbitrary base plate, such as a conventional base plate, can achieve the features as described herein. Features as described with respect to sensing/monitoring capabilities of the base plate herein can be provided by a sensor assembly of a sensor patch to be applied to a base plate, e.g. by the user, and vice versa. In embodiments, the sensor patch is adapted to adhere to a base plate, in particular to a proximal adhesive surface of a base plate.

In embodiments, a method of attaching a base plate having sensing capabilities, e.g. through the provision of a sensor patch, to a user's stoma and/or skin surrounding the stoma, such as the peristomal skin area, comprises attaching the sensor patch to a proximal (adhesive) surface of a base plate and attaching the base plate, i.e. together with the attached sensor patch, to the user's stoma and/or skin surrounding the stoma, such as the peristomal skin area. Alternatively, the method of attaching the base plate to the user's stoma and/or skin surrounding the stoma comprises attaching the sensor patch to the user's stoma and/or skin surrounding the stoma and attaching the base plate to the user's stoma and/or skin surrounding the stoma above the attached sensor patch, i.e. on a distal surface of the sensor patch.

In embodiments, the base plate and/or the sensor patch comprises an adhesive layer with a proximal side configured for attachment of the base plate and/or the sensor patch to the skin surface of a user. In embodiments, the adhesive layer has a stomal opening, such as a first adhesive stomal opening, with a centre point.

In embodiments, the base plate and/or sensor patch comprises at least one electrode (e.g. embodied as conductive traces), such as a plurality of electrodes including a first electrode, a second electrode, and a third electrode provided in an electrode assembly of a sensor assembly. In embodiments, the plurality of electrodes forms one or more sensors, when connected to a monitor device, configured to detect presence of liquid, such as output, on the proximal side of the adhesive layer and/or moisture content in the adhesive layer. In embodiments, the electrode assembly of the sensor assembly is configured to detect presence of liquid, such as output, on the proximal side of the adhesive layer and/or moisture content in the first adhesive layer in a primary sensing zone and a secondary sensing zone. In embodiments, the primary sensing zone is arranged in a primary angle space from the centre point of the first adhesive layer, and/or the secondary sensing zone is arranged in a secondary angle space, separate from the primary angle space, from the centre point of the first adhesive layer. Alternatively, or additionally, the primary sensing zone can be arranged in a primary radial space from the centre point of the first adhesive layer and the secondary sensing zone can be arranged in a secondary radial space from the centre point of the first adhesive layer. In embodiments, the electrode assembly of the sensor assembly is configured to detect presence of liquid, such as output, on the proximal side of the first adhesive layer and/or moisture content in the first adhesive layer in three or more sensing zones.

In embodiments, the monitor device of the ostomy system comprises a housing, a processor, a memory, a first interface connected to the processor and the memory, and a second interface connected to the processor. The first interface is configured for obtaining ostomy data from the sensor assembly, e.g. from the base plate and/or the sensor patch comprising the sensor assembly and coupled to the first interface. The ostomy data comprises primary ostomy data from a primary electrode set of the sensor assembly of the base plate and/or the sensor patch, and/or secondary ostomy data from a secondary electrode set of the sensor assembly of the base plate and/or the sensor patch. In embodiments, the processor is configured to: obtain primary parameter data based on the primary ostomy data; obtain secondary parameter data based on the secondary ostomy data; and detect presence of liquid on the proximal side of the adhesive layer and/or moisture in the adhesive layer in a primary sensing zone based on the primary parameter data. In embodiments, the primary sensing zone is arranged in a primary angle space from the centre point of the adhesive layer and/or arranged in a primary radial space from the centre point of the adhesive layer. Further, in embodiments, the processor is configured to detect presence of liquid on the proximal side of the adhesive layer and/or moisture in the adhesive layer in a secondary sensing zone based on the secondary parameter data. In embodiments, the secondary sensing zone is arranged in a secondary angle space from the centre point of the first adhesive layer and/or arranged in a secondary radial space from the centre point of the first adhesive layer. In embodiments, in accordance with a detection of presence of liquid and/or moisture in the primary sensing zone, the processor is configured to transmit a primary monitor signal comprising monitor data indicative of presence of liquid and/or moisture in the primary sensing zone via the second interface; and in accordance with a detection of presence of liquid and/or moisture in the secondary sensing zone, transmit a secondary monitor signal comprising monitor data indicative of presence of liquid and/or moisture in the secondary sensing zone via the second interface.

In embodiments, the monitor device is configured to apply a voltage across at least two electrodes, and to detect changes in current/resistance across said at least two electrodes. In embodiments, a change in resistance is indicative of the presence of liquid, such as stomal output and/or sweat, on a proximal surface of the base plate and/or sensor patch (e.g. in an interface between the skin surface and the base plate and/or sensor patch). In embodiments, a change in resistance is indicative of moisture absorption in the adhesive material of the base plate and/or sensor patch.

The base plate and/or the sensor patch comprises an adhesive layer, such as a first adhesive layer. During use, the first adhesive layer adheres to the user's skin (peristomal area) and/or to additional seals, such as sealing paste, sealing tape and/or sealing ring. Thus, in embodiments, the first adhesive layer is configured for attachment of the base plate and/or the sensor patch to the skin surface of a user. In embodiments, the first adhesive layer has a stomal opening, such as a first adhesive stomal opening, with a centre point or is at least prepared for forming a stomal opening with a centre point. A base plate and/or a sensor patch comprising a sensor assembly according to the present disclosure enables detection of presence of liquid or output on the proximal side of the first adhesive layer (in the interface between a skin surface of the user, such as the peristomal skin area, and the proximal surface of the first adhesive layer) and/or detection of moisture content in the first adhesive layer.

In embodiments, the first adhesive layer is made of a first composition. In embodiments, the first composition comprises one or more polyisobutenes and/or styrene-isoprene-styrene. In embodiments, the first composition comprises one or more hydrocolloids. In embodiments, the first composition comprises one or more water soluble or water swellable hydrocolloids. In embodiments, the first composition is a pressure sensitive adhesive composition suitable for medical purposes comprising a rubbery elastomeric base and one or more water soluble or water swellable hydrocolloids. In embodiments, the first composition comprises one or more polybutenes, one or more styrene copolymers, one or more hydrocolloids, or any combination thereof. The combination of the adhesive properties of the polybutenes and the absorbing properties of the hydrocolloids renders the first composition suitable for use in ostomy appliances. For example, the styrene copolymer can be a styrene-butadiene-styrene block copolymer or a styrene-isoprene-styrene block copolymer. Preferably, one or more styrene-isoprene-styrene (SIS) block type copolymers are employed. The amount of styrene block-copolymer can be from 5% to 20% of the total adhesive composition. The butene component is suitably a conjugated butadiene polymer selected from polybutadiene, polyisoprene. The polybutenes are preferably present in an amount of from 35-50% of the total adhesive composition. Preferably, the polybutene is polyisobutylene (PIB). Suitable hydrocolloids for incorporation in the first composition are selected from naturally occurring hydrocolloids, semi-synthetic hydrocolloids, and synthetic hydrocolloids. The first composition can comprise 20-60% hydrocolloids. A preferred hydrocolloid is carboxymethyl cellulose (CMC). Optionally, the first composition can contain other components, such as fillers, tackifiers, plasticizers, and/or other additives.

The first adhesive layer can have a substantially uniform thickness. The first adhesive layer can have a thickness in the range from 0.1 mm to 1.5 mm, e.g. in the range from 0.2 mm to 1.2 mm, such as 0.8 mm or 1.0 mm. The first adhesive layer can have a primary thickness in a primary part of the first adhesive layer, e.g. in a primary region within a primary radial distance or in a primary radial distance range from the centre point of the stomal opening. The primary thickness can be in the range from 0.2 mm to 1.5 mm, such as about 1.0 mm. The primary radial distance can be in the range from 20 mm to 50 mm, such as in the range from 25 mm to 35 mm, e.g. 30 mm. The first adhesive layer can have a secondary thickness in a secondary part of the first adhesive layer, e.g. in a secondary region outside a secondary radial distance or in a secondary radial distance range from the centre point of the stomal opening. The secondary thickness can be in the range from 0.2 mm to 1.0 mm, such as about 0.5 mm. The secondary radial distance can be in the range from 20 mm to 50 mm, such as in the range from 25 mm to 35 mm, e.g. 30 mm.

In embodiments, the base plate and/or the sensor patch comprises a second layer. In embodiments, the second layer is an adhesive layer. In embodiments, the second layer has a second radial extension that is larger than a first radial extension of the first adhesive layer at least in a first angular range of the base plate and/or the sensor patch. Accordingly, a part of a proximal surface of the second layer can be configured for attachment to the skin surface of a user. The part of a proximal surface of the second layer configured for attachment to the skin surface of a user is also denoted the skin attachment surface of the second adhesive layer. The second layer can have a stomal opening, such as a second layer stomal opening and/or a second adhesive stomal opening, with a centre point.

In embodiments, the second adhesive layer is made of a second composition. In embodiments, the second composition comprises one or more polyisobutenes and/or styrene-isoprene-styrene. In embodiments, the second composition comprises one or more hydrocolloids. In embodiments, the second composition comprises one or more water soluble or water swellable hydrocolloids. In embodiments, the second composition is a pressure sensitive adhesive composition suitable for medical purposes comprising a rubbery elastomeric base and one or more water soluble or water swellable hydrocolloids. In embodiments, the second composition comprises one or more polybutenes, one or more styrene copolymers, one or more hydrocolloids, or any combination thereof. The combination of the adhesive properties of the polybutenes and the absorbing properties of the hydrocolloids renders the second composition suitable for use in ostomy appliances. For example, the styrene copolymer can be a styrene-butadiene-styrene block copolymer or a styrene-isoprene-styrene block copolymer. Preferably, one or more styrene-isoprene-styrene (SIS) block type copolymers are employed. The amount of styrene block-copolymer can be from 5% to 20% of the total adhesive composition. The butene component is suitably a conjugated butadiene polymer selected from polybutadiene, polyisoprene. The polybutenes are preferably present in an amount of from 35-50% of the total adhesive composition. Preferably, the polybutene is polyisobutylene (PIB). Suitable hydrocolloids for incorporation in the second composition are selected from naturally occurring hydrocolloids, semisynthetic hydrocolloids, and synthetic hydrocolloids. The second composition can comprise 20-60% hydrocolloids. A preferred hydrocolloid is carboxymethyl cellulose (CMC). Optionally, the second composition can contain other components, such as fillers, tackifiers, plasticizers, and/or other additives.

Different ratio of contents can change properties of the first and/or second adhesive layers. In embodiments, the second adhesive layer and the first adhesive layer have different properties. In embodiments, the second adhesive layer (second composition) and the first adhesive layer (first composition) have different ratios of polyisobutenes, styrene-isoprene-styrene, and/or hydrocolloids. For example, the second adhesive layer can provide a stronger attachment to the skin compared to attachment to the skin provided by the first adhesive layer. Alternatively, or additionally, the second adhesive layer can be thinner than the first adhesive layer. Alternatively, or additionally, the second adhesive layer can be less water and/or sweat absorbing than the first adhesive layer. Alternatively, or additionally, the second adhesive layer can be less mouldable than the first adhesive layer. In embodiments, the second adhesive layer provides a second barrier against leakage.

The second layer can have a substantially uniform thickness. The second layer can have a thickness in the range from 0.1 mm to 1.5 mm, e.g. in the range from 0.2 mm to 1.0 mm, such as 0.5 mm, 0.6 mm, or 0.7 mm.

In embodiments, the first adhesive layer comprises a plurality of sensor point openings. In embodiments, a sensor point opening of the first adhesive layer is configured to overlap a (sensing) part of an electrode of the electrode assembly, e.g. to form a sensor point. In embodiments, the sensor point openings extend entirely through the first adhesive layer, such as to expose at least parts of the electrode assembly to the surroundings, such as to provide means for establishing a short-circuit between a first and a second electrode, a short-circuit being indicative of a presence of liquid, such as output, on the proximal surface of the base plate. Thus, in embodiments, the sensor point openings provide means for detecting the presence of liquid on the proximal surface of the base plate by monitoring the voltage across two electrodes of the electrode assembly. The presence of liquid on the proximal surface of the base plate may be indicative of output propagating in the interface between the proximal surface of the base plate and the peristomal skin surface of a user. In embodiments, the first adhesive layer comprises at least 10 sensor point openings, such as between 20 and 50 sensor point openings, in order to provide adequate leakage detection around the stoma of the user. In embodiments, the sensor point openings have a diameter of at least 1 mm, such as between 1.0 mm and 4.0 mm.

Providing a base plate having sensing capabilities, e.g. through an incorporated sensor assembly or through a sensor patch comprising a sensor assembly provides for an optimum or improved use of an ostomy appliance. In particular, it is facilitated that a base plate is not changed too late (leading to adhesive failure, leakage, and/or skin damage), or at least that a user is informed that a leakage will happen, is happening, or has happened. Accordingly, the user or a health care professional is able to monitor and plan the use of the ostomy appliance.

In embodiments of the medical appliance being a wound dressing, the wound dressing may comprise an absorbent core layer and an electrode assembly. In embodiments the wound dressing further comprises an adhesive layer arranged on a proximal side of the absorbent core layer, the adhesive layer having a proximal surface configured for attachment of the wound dressing to the skin surface of a user. In embodiments, the wound dressing comprises a monitor interface configured for electrically and/or mechanically facilitate coupling to a monitor device. In embodiments, the electrode assembly and the monitor interface are provided in a separate sensor pack layered with the wound dressing (absorbent core layer), thereby allowing an efficient manufacturing process, wherein the sensor pack can be assembled separately. It is an advantage of such wound dressing that an optimum or improved use of a wound dressing is enabled and facilitated. In particular, the present disclosure facilitates that a wound dressing is not changed too early (leading to increased costs and/or material waste) nor too late (leading to adhesive failure, leakage, and/or unsatisfactory wound healing conditions). Accordingly, the user or a health care professional is able to monitor and plan the use of the wound dressing. Determination of moisture or wetting patterns, such as exudate uptake patterns, and/or wetting types and/or classification of operating states of the wound dressing is useful in helping to reduce the risk of a user experiencing leakage from a wound dressing and/or in helping reduce the risk of unsatisfactory wound healing conditions. Embodiments of the present disclosure provides an efficient and easy-to-use wound dressing system with a high degree of comfort for a user.

In embodiments, the wound dressing of the wound dressing system comprises an adhesive layer having a proximal surface configured for attachment of the wound dressing to the skin surface of a user. The adhesive layer can comprise or be made of a first composition. In embodiments, the first composition comprises silicone. In embodiments, the adhesive layer comprises a support layer with an adhesive material made of a first composition moulded onto or otherwise attached to the support layer. In embodiments, the first composition is a thermoset, curable adhesive material. An example of such adhesive material can be a silicone based adhesive material. In embodiments, the first composition is a two-component system. Preferably, the first composition contains no solvent.

Preferred first compositions include polyurethane, acrylic, silicone or polyethylene or polypropylene oxide based cross-linking types, e.g. as described in WO 2005/032401. In embodiments, the first composition is a hotmelt type, which initially is heated to flow and subsequently cooled to gel or crosslink. In embodiments, instead of curing upon cooling, the first composition can in some embodiments cure upon application of thermal energy. In embodiments, the support layer of the first adhesive layer is any suitable layer being water impermeable but vapour permeable. A suitable support layer can be a polyurethane film.

In embodiments, the adhesive layer of the wound dressing of the wound dressing system has perforations or through-going openings arranged within an absorbing region, e.g. for allowing exudate from the wound to pass or flow through the perforations of the adhesive layer to be absorbed by the absorbent core layer arranged on the distal side of the adhesive layer. In embodiments, the perforations of the adhesive layer are made by punching, cutting, or by applying high frequency mechanical vibrations, for example as disclosed in WO 2010/061228. In embodiments, the perforations are arranged in a regular or random array, typically separated by 0.5 mm to 10 mm. The number of holes per cm2 may be between 1 and 100, such as between 1 and 50, or even between 2 and 20. In embodiments, the perforations of the adhesive layer have a diameter in the range from 0.5 mm to 10 mm, such as in the range from 1 mm to 8 mm. In one or more exemplary wound dressings, the perforations of the first adhesive layer have a diameter in the range from 1 mm to 5 mm, e.g. from 1.5 mm to 5 mm, and even in the range from 2 mm to 4 mm.

The wound dressing of the wound dressing system comprises an absorbent core layer also denoted an absorbent pad. In embodiments, the absorbent core layer is a uniform material or a composite, for example in the form of a layered construction comprising layers of different texture and properties. In embodiments, the absorbent core layer comprises foam, cellulose, super absorbent particles, and/or fibres. In embodiments, the absorbent core layer comprises a layer of foam facing the wound. In embodiments, the absorbent core layer comprises a polyurethane foam. In embodiments, the absorbent core layer comprises a super absorbing layer. In embodiments, the absorbent core layer can comprise one or more polyisobutenes and/or styrene-isoprene-styrene. In embodiments, absorbent core layer comprises one or more hydrocolloids, such as one or more water soluble or water swellable hydrocolloids. The absorbent core layer can be a pressure sensitive adhesive composition suitable for medical purposes comprising a rubbery elastomeric base. In embodiments, the absorbent core layer comprises an adhesive, such as known from adhesive hydrocolloid-comprising layers, whereby the absorbent core layer can be adhered directly to the skin/wound. In embodiments, the absorbent core layer and/or the adhesive layer contains active ingredients, such as ibuprofen, paracetamol, silver compounds, or other medically active ingredients and is/are configured to release the active ingredients to the wound to reduce pain and/or to improve the healing of the wound. In one or more exemplary wound dressings, the absorbent core layer comprises a silver compound with antimicrobial properties.

In embodiments, the medical appliance, e.g. a base plate or a wound dressing, comprises a top layer also denoted a backing layer or a top film. In embodiments, the top layer can be any suitable layer being water impermeable but vapour permeable. In embodiments, a suitable top layer is a polyurethane film. The top layer is a protective layer protecting features, such as an absorbent core of a wound dressing or an adhesive layer of a base plate, of the medical appliance from external strains and stress when the user wears the appliance. In embodiments, the top layer has a thickness in the range from 0.01 mm to 1.0 mm, e.g. in the range from 0.02 mm to 0.2 mm, such as 0.04 mm.

In embodiments, the top layer comprises a top layer opening configured to allow for connection between the plurality of electrodes of the electrode assembly and terminals of a monitor device. For example, the top layer opening can allow for a first part of the electrode assembly to extend through the top layer to form a part of a monitor interface of the medical appliance.

In embodiments, the medical appliance comprises a release liner, such as a one-piece, two-piece, or a three-piece release liner. The release liner is a protective layer that protects adhesive layer(s) during transport and storage and is peeled off by the user prior to applying the medical appliance on the skin.

In embodiments, each electrode comprises a connection part, e.g. to form a terminal of the monitor interface or for connecting the respective electrode to other components and/or to interface terminals/terminal elements. Thus, in embodiments, a connection part forms a terminal allowing a corresponding interface of a monitor device to be electrically coupled to the electrode(s).

In a first aspect of the invention, a medical appliance is disclosed. The medical appliance is substantially planar and extending in an appliance plane. The medical appliance comprises a first area and a second area in the appliance plane, the medical appliance having a first Young's modulus in the first area and a second Young's modulus in the second area, wherein the second Young's modulus is greater than the first Young's modulus. The medical appliance comprises one or more conductive traces extending in the appliance plane from within the first area to within the second area, the one or more conductive traces including a primary conductive trace, the primary conductive trace having a primary first part within the first area and a primary second part within the second area, and the primary conductive trace having a primary intermediate part between the primary first part and the primary second part. The primary first part has a primary first electrical resistance along the primary first part, the primary second part has a primary second electrical resistance along the primary second part, and the primary intermediate part has a primary intermediate electrical resistance along the primary intermediate part, and wherein the primary intermediate electrical resistance is lower than the primary first electrical resistance and lower than the primary second electrical resistance.

The medical appliance may be an ostomy appliance, such as a base plate for attachment to the skin surface of a user or a sensor patch for attachment to the adhesive surface of a base plate prior to attachment to the skin surface of a user, or a wound dressing for attachment to the skin surface of a user. In particular, the medical appliance may be an ostomy appliance or a wound dressing as previously disclosed.

The medical appliance is substantially planar. By substantially planar is meant that the medical appliance is substantially flat, such as is commonly the case for a base plate of an ostomy appliance or for a wound dressing. The medical appliance extends in an appliance plane, thereby defining the spatial extent of the medical appliance, in particular in the plane of the skin surface, when the medical appliance is worn by (e.g. adhered to) a user.

The medical appliance comprises a first area and a second area in the appliance plane. Thus, when viewed from above (i.e. in a direction normal to the appliance plane), at least two areas are defined. The first area may at least be defined as having a first Young's modulus and the second area may at least be defined as having a second Young's modulus. The second Young's modulus is greater than the first Young's modulus. In embodiments, the second Young's modulus is at least twice as big as the first Young's modulus. In embodiments, the second Young's modulus is at least 50% greater, at least 100% (i.e. twice) greater, at least 200% greater, at least 300% greater, at least 400% greater, or at least 500% greater than the first Young's modulus. In embodiments, the second Young's modulus is between 100% and 1000% greater than the first Young's modulus.

Within the present context, Young's modulus is used to denote the stretchability of the material, where a higher Young's modulus denotes a less stretchable material, and vice versa. Thus, the first area, having a lower Young's modulus, is more stretchable than the second area, having a higher Young's modulus. Such difference in Young's modulus creates an abrupt change in Young's modulus in the transition between the two areas. Thus, this transition becomes particularly exposed to rupture of conductive traces/electrodes herein, since stress may be "carried along" said transition due to the substantially non-stretchable material of the second area and the potentially highly stretchable material of the first area. In particular, the conductive traces may be prone to rupture due to a low integrity as caused by the inherent properties of printed conductive traces. Thus, merely small extensions may be enough for a printed electrode (conductive trace) to break/rupture.

In embodiments, the second area is enclosed by the first area. In embodiments, different material properties of the first area and the second area contribute to the first and second Young's modulus, respectively.

In general, Young's modulus, E, may be expressed by:

$$E = \frac{\sigma(\varepsilon)}{\varepsilon} = \frac{FL_0}{A\Delta L},$$

where $\sigma(\varepsilon)$ is the tensile stress and $\varepsilon$ is the engineering extensional strain in the elastic portion of the physical stress-strain curve, and where F is the force exerted on an object under tension, $L_0$ is the original length of the object, A is the actual cross-sectional area, which equals the area of the cross-section perpendicular to the applied force, and $\Delta L$ is the amount by which the length of the object changes.

Within the present disclosure, Young's modulus is used to express the stretchability (e.g. as expressed by $\Delta L$ in the above formula) of a given material. According to the first aspect of the invention, the second area is less stretchable than the first area (due to the inverse relationship between Young's modulus E and $\Delta L$). Thus, under the same conditions, $\Delta L$ for the first area is greater than $\Delta L$ for the second area. In other words, a greater force is required to stretch and/or deform and/or break a material of the second area than a material of the first area. In embodiments, the transition between the first area and the second area is an abrupt change in Young's modulus within the appliance plane.

Within the present disclosure, Young's modulus of a given area may be determined by means of applying a force F in the appliance plane within said area. The force F causes the area exerted by said force to extend/stretch by $\Delta L$. Thus, in embodiments, the force F is exerted in opposite directions, in order to generate a positive $\Delta L$. For example, Young's modulus of the first area may be determined by exerting an opposite directed force to a sample of the first area in the appliance plane and measuring the $\Delta L$. The cross-sectional area A and the original length of the object $L_0$ may be measured according to traditional means for measuring length.

By a conductive trace is meant an electrically conductive electrode/path provided by means of a printing process. Thus, in embodiments, a conductive trace may be denoted an electrode. A conductive trace may comprise a (hardened/cured) conductive ink. In embodiments, a conductive trace comprises an electrically conductive material, such as graphite/carbon, silver, or other commonly used material for use in a printing process. In embodiments, a conductive trace comprises one or more of metallic (e.g. silver, copper, gold, titanium, aluminium, stainless steel), ceramic (e.g. ITO), polymeric (e.g. PEDOT, PANI, PPy), and carbonaceous (e.g. carbon black, carbon nanotube, carbon fibre, graphene, graphite) materials.

In embodiments, the conductive ink is created by infusing graphite (carbon), silver, or other conductive materials, into ink. In embodiments, the one or more conductive traces are printed on a surface of the medical appliance. In embodiments, the surface may be a surface of a part/layer, such as a polymeric layer, of the medical appliance, such as an internal layer, such that the one or more conductive traces are sandwiched within the medical appliance.

The one or more conductive traces includes a primary conductive trace. In embodiments, the one or more conductive traces further include a secondary conductive trace, a tertiary conductive trace, etc. In embodiments, at least the secondary conductive trace comprises features similar to the features as described herein in relation to the primary conductive trace. In the following, embodiments of the primary conductive trace are discussed in greater detail, but it is appreciated that such embodiments may likewise apply to at least a secondary conductive trace.

The primary conductive trace has a primary first part arranged within, such as entirely within, the first area and a primary second part arranged within, such as entirely within, the second area, and a primary intermediate part arranged between the primary first part and the primary second part, such as partly within the first area and partly within the second area. Thus, the primary conductive trace is a continuous trace extending from within the first area to within the second area, divided into three integral/coherent parts: a first part, an intermediate part, and a second part. In the transition (in the following denoted the transition area) between the first area and the second area, the primary conductive trace comprises a primary intermediate part. Thus, the intermediate part of the primary conductive trace may be arranged partly within the first area and partly within the second area. In embodiments, the transition area comprises a part of the first area and a part of the second area. For example, in embodiments, the transition area, in the vicinity of the conductive trace, extends at least 2 mm into the first area and at least 2 mm into the second area, as measured along the primary conductive trace. In embodiments, the transition area extends between 2 mm and 15 mm, such as between 2 mm and 10 mm, such as between 3 mm and 6 mm, into the first area (as measured along the primary conductive trace) and between 2 mm and 15 mm, such as between 2 mm and 10 mm, such as between 3 mm and 6 mm, into the second area (as measured along the primary conductive trace).

The primary intermediate part is integral with the primary first part and the primary second part of the primary conductive trace, such that the primary conductive trace forms a continuous/unbroken electrically conductive electrode extending from the primary first part to the primary second part, through the primary intermediate part. Thus, the primary conductive trace may be printed in a single printing process.

The primary first part of the primary conductive trace has a primary first electrical resistance. The primary second part of the primary conductive trace has a primary second electrical resistance. The primary intermediate part has a primary intermediate electrical resistance. In embodiments, by the primary first, second and intermediate parts having a certain (first, second, intermediate) electrical resistance is meant that said parts have a certain resistance as measured along a unit length of each of said parts. Thus, in embodiments, the primary first part has a primary first electrical resistance per unit length, the primary second part has a primary second electrical resistance per unit length, and the primary intermediate part has a primary intermediate electrical resistance per unit length. In embodiments, a referral to an electrical resistance is a referral to an electrical resistance per unit length.

In general, electrical resistance, R, may be expressed by:

$$R = \rho \frac{l}{A}$$

where $\rho$ is the electrical resistivity of the material used, $l$ is the length of the conductor, and A is the cross-sectional area of the conductor. Thus, the above relation relates the physical dimensions of the conductor to the electrical resistance thereof.

The equation may be simplified when considering the resistance along a unit length (i.e. letting l=1) and when using the same material for all parts of the conductor (conductive trace) (i.e. letting $\rho$=1), which is the case within embodiments of the present disclosure. Further, the cross-sectional area A may be expressed by the width w and the thickness t of the conductor multiplied (thus, assuming a rectangular cross-section). In embodiments, the thickness of the conductive trace is constant (i.e. letting t=1) throughout the conductive trace. Thus, $$R \propto \frac{1}{A} \propto \frac{1}{w}$$

Thus, the resistance is inversely proportional with the width of the conductor.

It is appreciated that the above assumptions are provided for illustrative purposes only, and that other and/or additional assumptions may apply to other embodiments of the first aspect of the invention. For example, in embodiments, the thickness may vary, or the cross-section of the conductive trace may deviate from that of a rectangle, thus requiring other assumptions to be applied. Further, it is appreciated that whereas the above relation is primarily true for a homogeneous and static material, further or additional assumptions may be needed to model the resistance of a printed conductive trace comprising silver flakes as a result of the printing process, especially in a dynamic regime. However, for the purpose of discussing the relation between material size (cross-sectional area) and resistance, the relation may be used for illustrative purposes.

According to the first aspect of the invention, the primary intermediate electrical resistance is lower than the primary first electrical resistance and lower than the primary second electrical resistance. As may be realised from the above illustrative relation between electrical resistance and the width of the primary conductive trace, in embodiments, the primary intermediate electrical resistance may be provided by means of the primary intermediate part being wider than the primary first part and wider than the primary second part. In other words, the primary intermediate part comprises more material per unit length than each of the primary first part and the primary second part.

In embodiments, the primary intermediate electrical resistance is at least 10% lower than the primary first electrical resistance and the primary second electrical resistance. In embodiments, the primary intermediate electrical resistance is at least 20% lower, or at least 25% lower, or at least 50% lower, or at least 75% lower, or at least 100% lower, or at least 150% lower, or at least 200% lower than the primary first electrical resistance and the primary second electrical resistance.

Providing a primary intermediate part of the conductive trace having a lower electrical resistance, thereby indicating physical dimensions (e.g. width) being greater than neighbouring parts, provides a conductive trace being less prone to rupturing as a result of the transition between the first area and the second area having different stretchabilities (Young's moduli). In particular, as discussed above, where the second area has a second Young's modulus being greater than a first Young's modulus of the first area, the transition between said areas are likely to cause deformation, in particular deformation and/or rupture of the conductive trace. Through the provision of more conductive material (e.g. where the thickness is constant, a wider intermediate part) causing the resistance of the intermediate part being lower than the neighbouring primary first and second parts, the primary intermediate part is reinforced. Thereby, if the medical appliance is stretched, in particular in the (vicinity of the) transition area between the first area and the second area, the intermediate part of the conductive trace provides/constitutes a built-in redundancy, allowing for merely a partial rupture of said intermediate part of the primary conductive trace without causing a rupture of the conductive trace a such, whereby said conductive trace may still carry a signal from the first part to the second part through the (e.g. partially ruptured) intermediate part and vice versa.

Further, reinforcing the primary intermediate part by means of excess conductive material causing a lower electrical resistance than the neighbouring first and second parts provides for a reduced risk of generating faulty signals: a partial rupture of the intermediate part will increase the electrical resistance (since such rupture effectively reduces the physical properties (e.g. width) of the conductor), which could potentially disturb the signals carried through the conductive trace. However, by providing the intermediate part with physical properties inherently/initially reducing the electrical resistance, a partial rupture is less likely to cause an electrical resistance of said intermediate part to exceed the electrical resistance of the neighbouring first and second parts. Instead, a partial rupture within the present disclosure is more likely to cause the resistance of the intermediate part to be equal to, or similar to, the resistance of the first and second part, respectively. Thereby, where the signals carried through the conductive trace are indicative of a change in resistance (e.g. due to presence of liquid/moisture in a sensor), the change of resistance as caused by a partial rupture of the intermediate part is less likely to cause a faulty signal.

In embodiments, the thickness of the first part, the second part and/or the intermediate part of the conductive trace is the thickness as measured in a direction normal to the appliance plane. In embodiments, the thickness is constant across the first part, the second part and the intermediate part. In embodiments, the intermediate part has a thickness being greater than a thickness of the first part and the second part. In embodiments, the thickness is between 2 µm and 20 µm, such as between 4 µm and 10 µm, such as 6 µm.

In an embodiment, the primary first part has a primary first width in the appliance plane, the primary second part has a primary second width in the appliance plane, the primary intermediate part has a primary intermediate width in the appliance plane, wherein the primary intermediate width is greater than the primary first width and greater than the primary second width.

In embodiments, the primary intermediate width varies, such as being widest at a midway point between an end of the primary first part and an end of the primary second part (the ends being the ends adjacent to the intermediate part), wherein the greatest width of the primary intermediate part is greater than a width of any of the primary first width and the primary second width.

In embodiments, the primary intermediate width is an average width of the primary intermediate part, said average width being greater than an average width of the primary first part and an average width of the primary second part. In embodiments, the primary first part has a primary first average width, the primary second part has a primary second average width, and the primary intermediate part has a primary intermediate average width, wherein the primary intermediate average width is greater than the primary first average width and greater than the primary second average width.

In embodiments, the primary intermediate width is at least 10% greater than the primary first width and the primary second width. In embodiments, the primary intermediate width is at least 20% greater, or at least 25% greater, or at least 50% greater, or at least 75% greater, or at least 100% greater, or at least 150% greater, or at least 200% greater than the primary first width and the primary second width.

The same considerations may apply to a situation wherein the width is constant but an (average) thickness of the primary intermediate part is greater than an (average) thickness of the primary first/second parts.

In embodiments, the width of the first part, the second part and/or the intermediate part is the width as measured perpendicular to the direction/path of the conductive trace (in the appliance plane). In embodiments, e.g. where the conductive trace comprises a non-linear segment, such as in the vicinity of the intermediate part, the width is the width as measured perpendicular to a tangent of the direction/path of the conductive trace at the given point (in the appliance plane). In embodiments, the primary intermediate width is measured along the transition between the first area and the second area.

As previously discussed, increasing the width of the primary intermediate part reduces the electrical resistance of said primary intermediate part, in particular where the thickness of the conductive trace is constant throughout the first part, the second part and the intermediate part. Further, by increasing the width of the primary intermediate part, a possible partial rupture of part of said primary intermediate part, e.g. as a result of stretching the medical appliance, is less likely to cause a rupture of the conductive trace as such. And even in the event of a partial rupture, the initial lower electrical resistance reduces the risk of generating faulty signals, as such partial rupture may merely increase the electrical resistance to be similar to the primary first and/or second electrical resistance.

In an embodiment, the primary intermediate part in the appliance plane encircles one or more primary non-conductive areas having a lower electrical conductivity than the primary intermediate part. In an embodiment, the primary intermediate part comprises a plurality of primary subbranches encircling the one or more non-conductive areas.

In embodiments, the one or more primary non-conductive areas are electrically insulating, such that said primary non-conductive areas cannot conduct a current/signal. In embodiments, the one or more primary non-conductive areas are characterised by the absence of conductive material, such as the absence of conductive ink forming the conductive trace. Thus, in embodiments, the primary non-conductive areas are areas wherein conductive ink has not been provided/printed on a (non-conductive, e.g. a polymer) supporting surface.

In embodiments, by encircling is meant that the primary intermediate part comprises two or more, such as a plurality of, subbranches, such that, going from either the primary first part or the primary second part, the conductive trace branches off into the two or more subbranches and later reconnect by the primary second part or the primary first part, respectively. Thereby, said two or more subbranches encircle at least one non-conductive area in the appliance plane.

Thereby, if exposed to a stretch, the rupture of one subbranch of the primary intermediate part does not compromise the properties of the conductive trace as such, as a current/signal may still be conducted through the non-ruptured subbranch(es). Further, the presence of a non-conductive area(s) encircled by the primary intermediate part reduces the amount of conductive ink, such that an optimised material usage is provided.

Further, a more deterministic series of ruptures is provided from providing a plurality of subbranches: the rupture of a single subbranch, e.g. as caused by a stretch, causes a discrete increase in electrical resistance, rather than a continuous increase, which may be more difficult to model in a computer model. In embodiments, the width of the primary intermediate part is the sum of the widths of each of the two or more subbranches. In embodiments, the widths of each of the two or more subbranches is measured along the transition between the first area and the second area.

In an embodiment, edges between the one or more primary non-conductive areas and the primary intermediate part are non-linear. In embodiments, the edges are the edges in the appliance plane.

Thereby is provided an intermediate part having an organic shape, i.e. a shape having a curving, irregular, or asymmetrical appearance. For example, the primary intermediate part may have a shape resembling a river delta of branching subbranches, or a capillary network. Providing an intermediate part having an organic shape provides for reduced risk of rupturing caused by stretching. In particular, the provision of a curving conductive trace, or curving subbranches of the intermediate part, provides for an inherent ability to stretch by an amount greater than provided by a linear subbranch. In other words, the curving nature of the intermediate part, or subbranches thereof, provides for an ability of said part/subbranches to stretch to a point where the curving shape has become linear due to the applied force causing the stretch. Thus, in addition to the previous advantages of providing the intermediate part with a lower electrical resistance, e.g. due to the increased amount of material (e.g. through a wider conductive trace), the curving shape provides for an additional and/or increased resilience to rupture due to stress/over-stretching.

In embodiments, a path length of any of the two or more subbranches is greater than a linear distance between the first part and the second part. In other words, any of the two or more subbranches are longer than the linear distance between a point where the primary first part branches off into the primary intermediate part to a point where the primary second part branches off into the primary intermediate part, whereby such two or more subbranches have a curving path in the appliance plane, thereby providing a built-in redundancy for providing increased stretchability, and thus reduced risk of rupture.

In alternative embodiments, the edges between the one or more primary non-conductive areas and the primary intermediate part are linear.

In an embodiment, each of the plurality of primary subbranches has a primary subbranch electrical resistance, wherein the primary subbranch electrical resistance is lower than or equal to the primary first electrical resistance and lower than or equal to the primary second electrical resistance. In embodiments, each of the plurality of primary subbranches has a primary subbranch electrical resistance, such as per unit length, along the respective primary subbranch.

Thereby, in case all but one subbranch have ruptured due to over-stretching, the last remaining intact subbranch will have a resistance lower than or equal to the primary first and/or second electrical resistance. Thereby, the remaining subbranch does not cause an increased electrical resistance through the conductive trace, potentially giving rise to a faulty signal as previously discussed.

In an embodiment, the medical appliance comprises a support layer, wherein the one or more conductive traces are provided on a proximal side of the support layer.

In embodiments, the support layer may be denoted a support film. In embodiments, by a support layer is meant a coherent flexible and/or elastic sheet substantially covering the entire surface or side of an object, such as the medical appliance. In embodiments, the support layer is liquid impermeable but vapour permeable.

Where the medical appliance is an ostomy appliance comprising a base plate, the support layer may cover the entire distal side of an adhesive layer of the base plate. The support layer may protect the first adhesive layer from dirt and from external stress and strain, such as caused by handling. The support layer may also be denoted a backing layer in the field, or, in embodiments, a top film, indicating the support layer being the distal-most layer/film of the base plate. In embodiments, the distal and/or proximal surface of the support layer is non-adhesive. In embodiments, the distal and/or proximal surface of the support layer is adhesive.

Generally, the above considerations may likewise be applied to a wound dressing, in embodiments where the medical appliance is a wound dressing, e.g. a wound dressing comprising a foam material, and where the support layer may be arranged on a distal side of such a foam material.

By providing the one or more conductive traces on a proximal side of a support layer, said conductive traces may be arranged in contact with, or in liquid communication with, an adhesive layer and/or a skin surface of the user, whereby said conductive traces may form sensors suitable for sensing characteristics of the skin or presence of fluids, such as stomal output or wound exudate in an interface between the skin surface of the user and the medical appliance, or presence of moisture in the adhesive layer of the ostomy appliance and/or wound dressing, and/or in the foam material of the wound dressing.

In embodiments, the support layer is flexible and/or elastic/stretchable. In a preferred embodiment, the support layer is flexible and elastic. In an embodiment, the support layer is made of a polymeric material. In a preferred embodiment, the support layer is made of polyurethane (PU), e.g. thermoplastic polyurethane (TPU). In alternative embodiments, the support layer material can be made of or comprise one or more of PTFE, PVDF, polyester (e.g. PET), a thermoplastic elastomer (TPE), polyimide, polyimide, Ethylene-vinyl acetate (EVA), polyurea, and/or silicones. Exemplary thermoplastic elastomers (TPEs) of the top film include styrenic block copolymers (TPS, TPE-s), thermoplastic polyolefin elastomers (TPO, TPE-o), thermoplastic Vulcanizates (TPV, TPE-v), thermoplastic polyurethanes (TPU), thermoplastic copolyester (TPC, TPE-E), and thermoplastic polyamides (TPA, TPE-A).

A (T)PU-film is a preferred material for the support layer due to its highly flexible and elastic properties allowing for a likewise flexible and elastic medical appliance, such as a base plate or a wound dressing. Further, (T)PU belongs to a group of materials being a suitable substrate for printed electrodes, i.e. (T)PU is a suitable substrate for an electrode printing process, whereby printed electrodes (conductive traces) can be formed on a surface of the (T)PU film.

In embodiments, the support layer has a thickness between 20 µm and 60 µm, in particular between 35 µm and 50 µm, such as 42 µm. A thickness within the indicated range, such as 42 µm, has been found to be suitable for a base plate of an ostomy appliance, in particular because the indicated thickness provides an adequate amount of rigidity to the base plate, thereby easing handling, but reducing skin damage.

In embodiments, the Young's modulus of the support layer is lower than or equal to the first Young's modulus and/or lower than or equal to the second Young's modulus. In embodiments, the support layer is arranged in at least the first area of the medical appliance. In embodiments, the support layer covers the first area and the second area, wherein either the first area or the second area comprises additional elements for providing the second area with a second Young's modulus being greater than a first Young's modulus of the first area. In other words, in embodiments, the Young's modulus of the support layer may contribute to the first and/or second Young's modulus.

Within the present disclosure, the Young's modulus of the one or more conductive traces is considered negligible in the contribution to the first Young's modulus and the second Young's modulus.

In an embodiment, the medical appliance comprises a reinforcement element extending throughout the second area of the medical appliance. In an embodiment, Young's modulus of the reinforcement element is greater than Young's modulus of the support layer.

In embodiments, the reinforcement element is arranged in at least the second area of the medical appliance. In embodiments, the reinforcement element is layered, such as laminated, with the support layer. Thereby, where the support layer is arranged in at least the second area, at least the support layer and the reinforcement element in combination provides the second area with the second Young's modulus. Thus, in embodiments, the Young's modulus of the reinforcement element may contribute to the second Young's modulus. In other words, the second area may comprise the reinforcement element and the support layer laminated, whereby at least the combined Young's moduli of said reinforcement element and support layer contributes to the second Young's modulus of the second area.

Thereby, the medical appliance may be reinforced in a certain area, such as the second area, by means of a reinforcement element, potentially in combination with the support layer. Having a second area being less stretchable (higher Young's modulus) may be preferred where said second area is more prone to stretching and/or comprises a monitor interface for coupling to a monitor device. For example, the second area may be a neck portion of a base plate or a sensor patch, said base plate or sensor patch comprising means (sensors) for detecting presence of liquid in an interface between the skin surface of a user and the base plate and/or for detecting moisture in an adhesive material of such a base plate. The neck portion may extend radially away from the base plate/sensor patch, such as radially away from a stomal opening of a base plate/sensor patch, such as for providing a coupling to a monitor device away from the peristomal skin area. When extending radially away from the base plate, the neck portion may experience greater stress and stretching, such as when the user moves/bends, and as such, there is a need to reinforce such neck portion. The same considerations may apply to the use in a wound dressing, where the neck portion may be provided to avoid disturbances to the wound bed, i.e. to provide the coupling to a monitor device away from the wound.

In embodiments, the reinforcement element may be denoted a reinforcement layer or film. In embodiments, the reinforcement element is a polymeric material having a greater Young's modulus than the support layer. In particular, the Young's modulus of the reinforcement element is of a magnitude sufficient to prevent stretching within a normal use of the medical appliance. In embodiments, the reinforcement element is flexible. For example, the reinforcement element is a layer or film adapted to be laminated onto the support layer, thereby increasing the effective Young's modulus (hereby, the second Young's modulus) of the medical appliance in the area of the support layer and reinforcement element (hereby, the second area).

In embodiments, the elasticity of the reinforcement element is less than the elasticity of the one or more conductive traces and/or the elasticity of the support layer. Thereby, the reinforcement element becomes a limiting component (in the second area) of the medical appliance, such that the one or more conductive traces cannot (in normal use) be overstretched and rupture in at least the second area.

In an embodiment, at least the primary second part of the primary conductive trace is provided between the support layer and the reinforcement element. In embodiments, at least the primary second part of the primary conductive trace is arranged on a proximal side of the support layer and on a distal side of the reinforcement element.

In embodiments, approximately half (such as between 40% and 60%, such as between 45% and 55%) of the primary intermediate part of the primary conductive trace is provided between the support layer and the reinforcement element. Thereby, said half of the primary intermediate part is arranged within the second area.

Correspondingly, in embodiments, approximately half (such as between 60% and 40%, such as between 55% and 45%) of the primary intermediate part is provided outside the reinforcement element in the appliance plane, such that said half of the primary intermediate part is arranged within the first area.

Thereby, in continuation of previous embodiments, at least the primary second part of the primary conductive trace is reinforced by means of the reinforcement element, such that said part is less prone to rupturing. According to the first aspect of the invention, the transition from the second area to the first area and vice versa is reinforced by means of the provision of a primary intermediate part of the primary conductive trace.

In an embodiment, the medical appliance comprises an adhesive layer, wherein the one or more conductive traces is provided between the support layer and the adhesive layer. In embodiments, the adhesive layer is an adhesive layer of a base plate of an ostomy appliance or a sensor patch for attachment to a base plate, as previously disclosed. In embodiments, the adhesive layer is an adhesive layer of a wound dressing, as previously disclosed.

In embodiments, the adhesive layer covers an entire proximal side of the support layer. In embodiments, the adhesive layer comprises a proximal surface for attachment to the skin surface of a user. In embodiments, the one or more conductive traces are arranged on a distal side, such as on a distal surface, of the adhesive layer. In embodiments, the Young's modulus of the adhesive layer and the Young's modulus of the support layer in combination contribute to the first Young's modulus. In embodiments, the Young's modulus of the adhesive layer, the Young's modulus of the support layer and the Young's modulus of the reinforcement element in combination contribute to the second Young's modulus.

In embodiments, the planar extent (in the appliance plane) of the adhesive layer and of the support layer is greater than the planar extent of the reinforcement element. In embodiments, the first area is greater than the second area in the appliance plane.

In an embodiment, the medical appliance comprises an insulative masking layer comprising one or more openings, wherein the one or more conductive traces is provided between the support layer and the masking layer.

In embodiments, the masking layer is less electrically conductive than the one or more conductive traces. In embodiments, the masking layer is provided in at least the first area of the medical appliance. In an embodiment, the masking layer is provided between the support layer and the adhesive layer. In embodiments, the masking layer is provided between the one or more conductive traces and the adhesive layer.

In embodiments, the primary first part of the primary conductive trace comprises one or more sensing parts and one or more conductor parts, wherein the one or more sensing parts are aligned with the one or more openings of the masking layer. In embodiments, the adhesive layer comprises one or more sensor point openings, the one or more sensor point openings being aligned with the one or more openings of the masking layer. Thus, in embodiments, the masking layer defines a series of sensor points of the medical appliance. In particular, the masking layer defines the sensor point openings by means of providing a path (e.g. for a liquid) between a proximal surface of the adhesive layer and the sensing part of the conductive trace. Thereby, the masking layer serves to prevent liquid from causing false or noisy signals, by defining where liquid is to reach the conductive trace.

In embodiments, the Young's modulus of the masking layer contributes to the first Young's modulus and/or the second Young's modulus. In embodiments, the first Young's modulus is composed of the Young's modulus of the adhesive layer, the support layer and the masking layer. In embodiments, the second Young's modulus is composed of the Young's modulus of the adhesive layer, the support layer, the reinforcement element and the masking layer. In embodiments, the layers are laminated and/or adhered to each other. In embodiments, the masking layer has a thickness between 10 and 30 μm, such as between 12 μm and 20 μm, such as 16 μm. In embodiments, the masking layer is an acrylate lacquer, such as a UV curable acrylate lacquer. In embodiments, the masking layer may be deposited according to a predefined pattern on the proximal surface of the support layer/conductive traces.

In an embodiment, the one or more conductive traces includes a secondary conductive trace. The secondary conductive trace has a secondary first part within the first area and a secondary second part within the second area. The secondary conductive trace has a secondary intermediate part between the secondary first part and the secondary second part. The secondary first part has a secondary first electrical resistance along the secondary first part, the secondary second part has a secondary second electrical resistance along the secondary second part, and the secondary intermediate part has a secondary intermediate electrical resistance along the secondary intermediate part. The secondary intermediate electrical resistance is lower than the secondary first electrical resistance and lower than the secondary second electrical resistance.

Thus, in embodiments, the medical appliance comprises at least two conductive traces, wherein both the primary conductive trace and the secondary conductive trace comprise the features of the primary conductive trace according to previous embodiments. In embodiments, the electrical resistances are the electrical resistances per unit length.

Providing two conductive traces having means for reducing the risk of failure due to rupturing may be advantageous in a medical appliance having a neck portion where two "corners" are formed (one on each side), each of such corners being particularly exposed and thus prone to stretching.

In embodiments, the secondary first part has a secondary first width in the appliance plane, the secondary second part has a secondary second width in the appliance plane, the secondary intermediate part has a secondary intermediate width in the appliance plane, wherein the secondary intermediate width is greater than the secondary first width and greater than the secondary second width. Further embodiments and benefits are similar to the embodiments and benefits as disclosed above in relation to the primary conductive trace.

In embodiments, the secondary intermediate part in the appliance plane encircles one or more secondary non-conductive areas having a lower electrical conductivity than the secondary intermediate part. In embodiments, the secondary intermediate part comprises a plurality of secondary subbranches encircling the one or more non-conductive areas. Further embodiments and benefits are similar to the embodiments and benefits as disclosed above in relation to the primary conductive trace.

In embodiments, edges between the one or more secondary non-conductive areas and the secondary intermediate part are non-linear. Further embodiments and benefits are similar to the embodiments and benefits as disclosed above in relation to the primary conductive trace.

In embodiments, each of the plurality of secondary subbranches has a secondary subbranch electrical resistance, wherein the secondary subbranch electrical resistance is lower than or equal to the secondary first electrical resistance and lower than or equal to the secondary second electrical resistance. Further embodiments and benefits are similar to the embodiments and benefits as disclosed above in relation to the primary conductive trace.

In an embodiment, the one or more conductive traces includes a tertiary conductive trace. The tertiary conductive trace has a tertiary first part within the first area and a tertiary second part within the second area. The tertiary conductive trace has a tertiary intermediate part between the tertiary first part and the tertiary second part. The tertiary first part has a tertiary first electrical resistance along the tertiary first part, the tertiary second part has a tertiary second electrical resistance along the tertiary second part, and the tertiary intermediate part has a tertiary intermediate electrical resistance along the tertiary intermediate part. The tertiary intermediate electrical resistance is substantially the same as the tertiary first electrical resistance and/or the tertiary second electrical resistance.

Thus, the tertiary conductive trace differs from the primary and/or the secondary conductive trace in that the electrical resistance of the tertiary intermediate part is substantially the same as the tertiary first electrical resistance and the tertiary second electrical resistance. Thereby, the tertiary intermediate part may differ from the primary intermediate part and/or the secondary intermediate part in that said tertiary intermediate part may not comprise physical shapes and/or dimensions affecting, in particular lowering, the electrical resistance. Rather, in embodiments, the tertiary intermediate part is substantially identical to the tertiary first and second part, such that said tertiary intermediate part does not comprise a built-in redundancy purposively reinforcing the tertiary conductive trace. Thereby, the medical appliance may both comprise conductive traces having such built-in redundancy (e.g. the primary and/or secondary conductive trace) and conductive traces lacking such redundancy in the transition area. Thereby, the medical appliance may be equipped with reinforced conductive traces only in regions particularly exposed to stretching, such as in corner portions, whereas remaining conductive traces may lack such reinforcement, thereby reducing the material used, and further reducing the space needed for each conductive trace. In particular, according to embodiments where the primary and/or secondary intermediate parts are wider than the corresponding primary/secondary first/second parts, such intermediate parts may take up space in the appliance plane. By providing intermediate parts having a lower electrical resistance in regions particularly exposed to stretching only, more room is provided for further conductive traces, such as the tertiary conductive trace.

In an embodiment, the tertiary intermediate part is arranged between the primary intermediate part and the secondary intermediate part in the appliance plane. In embodiments, the tertiary conductive trace is arranged between the primary conductive trace and the secondary conductive trace in the appliance plane. In embodiments, the tertiary first part is arranged between the primary first part and the secondary first part in the appliance plane. In embodiments, the tertiary second part is arranged between the primary second part and the secondary second part in the appliance plane.

Thereby, the primary conductive trace and the secondary conductive trace may be the outer-most conductive traces of the medical appliance in the appliance plane, such that the tertiary conductive trace is arranged between the primary and secondary conductive traces. Thereby, the reinforcing properties of the primary intermediate part and the secondary intermediate part may be more exposed to stretching, whereas the tertiary intermediate part is protected from such stretching.

In an embodiment, the medical appliance is a sensor patch for an ostomy appliance, wherein the medical appliance is configured to be layered with an adhesive layer of the ostomy appliance. The sensor patch may be a sensor patch as previously defined and disclosed. Providing a sensor patch having reinforced intermediate parts of the conductive traces allows for accommodating the handling and stretching a user may exert on such sensor patch during application to the adhesive surface of the base plate according to previously disclosed methods. Further, as a sensor patch may comprise a neck portion extending radially away from a stomal opening of the sensor patch, corner portions of the sensor patch may be particularly prone to over-stretching. However, conductive traces arranged in proximity to such corner portions may be reinforced by means of the primary/secondary intermediate parts as disclosed previously.

In an embodiment, the medical appliance is a base plate for an ostomy appliance with a proximal side configured for attachment of the base plate to the skin surface of a user. Thereby, conductive traces provided in the base plate are reinforced according to previous embodiments. In embodiments, the base plate comprises a neck portion, similar to the embodiment of the sensor patch disclosed above.

In a second aspect of the invention, a method of manufacturing a medical appliance is disclosed. The method comprises providing a support layer extending in an appliance plane and printing one or more conductive traces on the support layer from within a first area to within a second area, such that the one or more conductive traces includes a primary conductive trace having a primary first part within the first area and a primary second part within the second area, and the primary conductive trace has a primary intermediate part between the primary first part and the primary second part, and such that the primary first part has a primary first electrical resistance along the primary first part, the primary second part has a primary second electrical resistance along the primary second part, and the primary intermediate part has a primary intermediate electrical resistance along the primary intermediate part, and wherein the primary intermediate electrical resistance is lower than the primary first electrical resistance and lower than the primary second electrical resistance.

The conductive traces may be formed by a conductive ink, such as silver or carbon, as previously disclosed in relation to the first aspect of the invention. In embodiments, the primary first part, the primary second part, and the primary intermediate part are printed in a single process, thereby forming a continuous primary conductive trace.

Embodiments and benefits as disclosed in relation to the first aspect of the invention are considered applicable to the method as disclosed herein. For example, in embodiments, the method of manufacturing comprises printing the primary conductive trace according to a predefined pattern. In embodiments, the predefined pattern comprises two or more subbranches of the primary intermediate part, thereby defining one or more non-conductive areas having a lower electrical conductivity than the primary intermediate part.

In an embodiment, the method further comprises applying a reinforcement element to extend throughout the second area, and such that at least the primary second part of the primary conductive trace is provided between the support layer and the reinforcement element.

In embodiments, the reinforcement element contributes to a second Young's modulus of the second area being greater than a first Young's modulus of the first area.

DETAILED DESCRIPTION OF THE DRAWINGS

FIG. 1 illustrates a medical appliance 100 according to embodiments of the invention. The medical appliance 100 comprises a main portion 101 and a neck portion 102 extending radially away from the main portion, as indicated by the arrow A. The medical appliance 100 may be an ostomy appliance, such as a base plate or a sensor patch for attachment to the proximal surface of a base plate, or a wound dressing. The medical appliance 100 is substantially planar/flat and extends in/spans an appliance plane (x,y). For example, the medical appliance 100 may have a thickness of maximally 10 mm, or maximally 5 mm.

The neck portion 102 may comprise a monitor interface 103 providing for a coupling to a monitor device (not shown). Providing a neck portion 102, such as having a length of at least 2 cm or at least 5 cm, allows for connecting the monitor device to the medical appliance distant from the ostomy or wound, thereby reducing the discomfort from coupling and wearing a monitor in close proximity of the ostomy or wound. The provision of a neck portion 102 as illustrated forms two corner portions 104a, 104b in the transition between the main portion 101 and the neck portion 102. Such corner portions 104a, 104b may be particularly prone to stretching, e.g. during handling or wear, as will be discussed in more detail below.

The medical appliance 100 comprises a first area 111 and a second area 112 (highlighted by a dashed box). The first area 111 has a first Young's modulus, and the second area 112 has a second Young's modulus. The second Young's modulus is greater than the first Young's modulus. In other words, the second area 112 is less stretchable than the first area 111.

According to the illustrated embodiment, the first area 111 covers at least the entire main portion 101, and the second area 112 covers a part of the neck portion 102. Thus, according to the illustrated embodiment, the main portion 101 is more stretchable than parts of the neck portion 102. For example, this allows for easier manipulation of the main portion 101, e.g. during handling or adjustment of the main portion around an ostomy (if base plate) or a wound (if wound dressing). Likewise, the neck portion is reinforced (less stretchable due to a relatively higher Young's modulus), such as for supporting the monitor interface and protecting conductive traces provided therein, as a radial force/stretch (radial direction illustrated by arrow A) is likely to be applied to the neck portion 102, e.g. during handling or in case the neck portion 102 comprises an adhesive to be adhered to the skin surface, such that a stretch may occur when the user bends/moves. In other words, since the neck portion 102 extends radially away from the main portion 101, the neck portion 102 may be more prone to stretching in such radial direction A due to handling/movement, which may be remedied by the higher Young's modulus, which may substantially inhibit overstretching.

The medical appliance 100 comprises one or more conductive traces, including a primary conductive trace 121 (illustrated partially), for forming sensors (a conductive trace may also be denoted an electrode), such as sensors for detecting presence of liquid and/or moisture, such as in/near the main portion 101. The one or more conductive traces extend in the appliance plane (x,y) from within the first area 111 to within the second area 112. The sensors may be operated by means of a monitor device coupled to the medical appliance 100 through the monitor interface 103.

The primary conductive trace 121 comprises a primary first part 121a, a primary second part 121b, and a primary intermediate part 121c. The primary first part 121a is arranged (e.g. entirely) within the first area 111, the primary second part 121b is arranged (e.g. entirely) within the second area 112, and the primary intermediate part 121c is arranged partly within the first area 111 and partly within the second area 112, such that the primary intermediate part 121c is arranged between the primary first part 121a and the primary second part 121b, when going from the first part to the second part, and vice versa.

The primary first part 121a has a primary first electrical resistance R1 along the primary first part, such as a primary first electrical resistance per unit length, the primary second part 121b has a primary first electrical resistance R2 along the primary second part, such as a primary first electrical resistance per unit length, and the primary intermediate part 121c has a primary intermediate electrical resistance R3 along the primary intermediate part, such as a primary intermediate electrical resistance per unit length. The primary intermediate electrical resistance R3, such as the primary intermediate electrical resistance per unit length, is lower than the primary first electrical resistance R1, such as lower than the primary first electrical resistance per unit length, and lower than the primary second electrical resistance R2, such as lower than the primary second electrical resistance per unit length: R3<R1 and R3<R2. The primary first electrical resistance R1, such as the primary first electrical resistance per unit length, and the primary second electrical resistance R2, such as the primary second electrical resistance per unit length, may be substantially equal: R1=R2.

According to the general relation between the physical dimensions of a conductor and the associated electrical resistance, the above relationship between the primary first electrical resistance R1, the primary second electrical resistance R2, and the primary intermediate electrical resistance R3 may be realised by means of increasing the width (here, in the appliance plane) of the primary intermediate part 121c, as illustrated in FIG. 1. Alternatively, the lower primary intermediate electrical resistance R3 may be realised by means of increasing the thickness of the primary intermediate part 121c.

The increased width of the primary intermediate part 121c provides a built-in redundancy, such that rupture of the conductive trace 121 is less likely. By a rupture is meant a (complete) rupture inhibiting the flow of current/signal from the primary first part 121a to the primary second part 121b. On the contrary, a partial rupture of the conductive trace does not inhibit the flow of current but may increase the effective electrical resistance through the conductor. As previously mentioned, a rupture may be more likely in the transition from the first area to the second area, in particular in the region of the corner portions 104a, 104b.

The greater width of the primary intermediate part 121c provides that a partial rupture does not affect the functionality of the primary conductive trace 121 as such. Rather, a partial rupture may merely increase the resistance of the primary intermediate part 121c to a point where said resistance equals the resistances R1, R2 of the primary first and second parts. Thereby, a partial rupture does not cause interference of the signals/currents flowing/conducted through the conductive trace: the inherent lower primary intermediate electrical resistance R3 allows for an increase not causing interference/faulty signals, since the resistance is less likely to exceed the inherent electrical resistances R1, R2 of the primary first and second parts.

Figure 2:
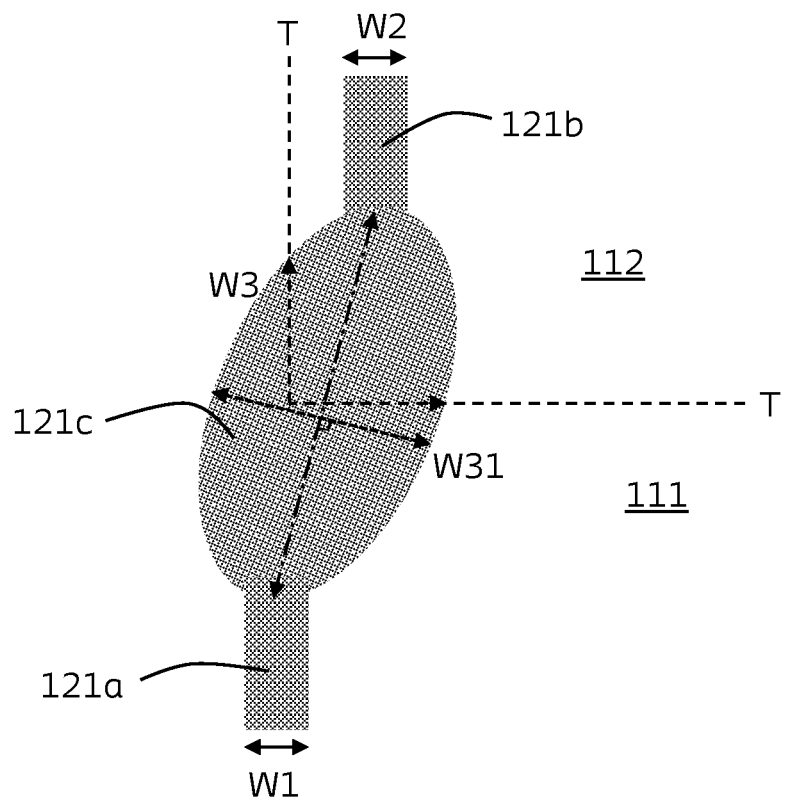
FIG. 2 illustrates a schematic close-up of a medical appliance according to an embodiment of the invention.

FIG. 2 illustrates a schematic close-up of the medical appliance of FIG. 1, in particular of the primary intermediate part 121c. A transition T from the first area 111 to the second area 112 is illustrated by a dashed line. Here, the primary intermediate part 121c is arranged in a corner part of the transition T. The width W3 of the primary intermediate part may be measured along the transition T. The width W1 of the primary first part 121a may be measured in a direction perpendicular to the direction/path of said first part. Likewise, the width W2 of the primary second part 121b may be measured in a direction perpendicular to the direction/path of said second part. Alternatively, the width W31 of the primary intermediate part 121c may be the greatest linear distance perpendicular to the direction (dashed-dotted arrow) between the primary first part 121a and the primary second part 121b, from one side of the primary intermediate part 121c to a second side thereof.

Figure 3:
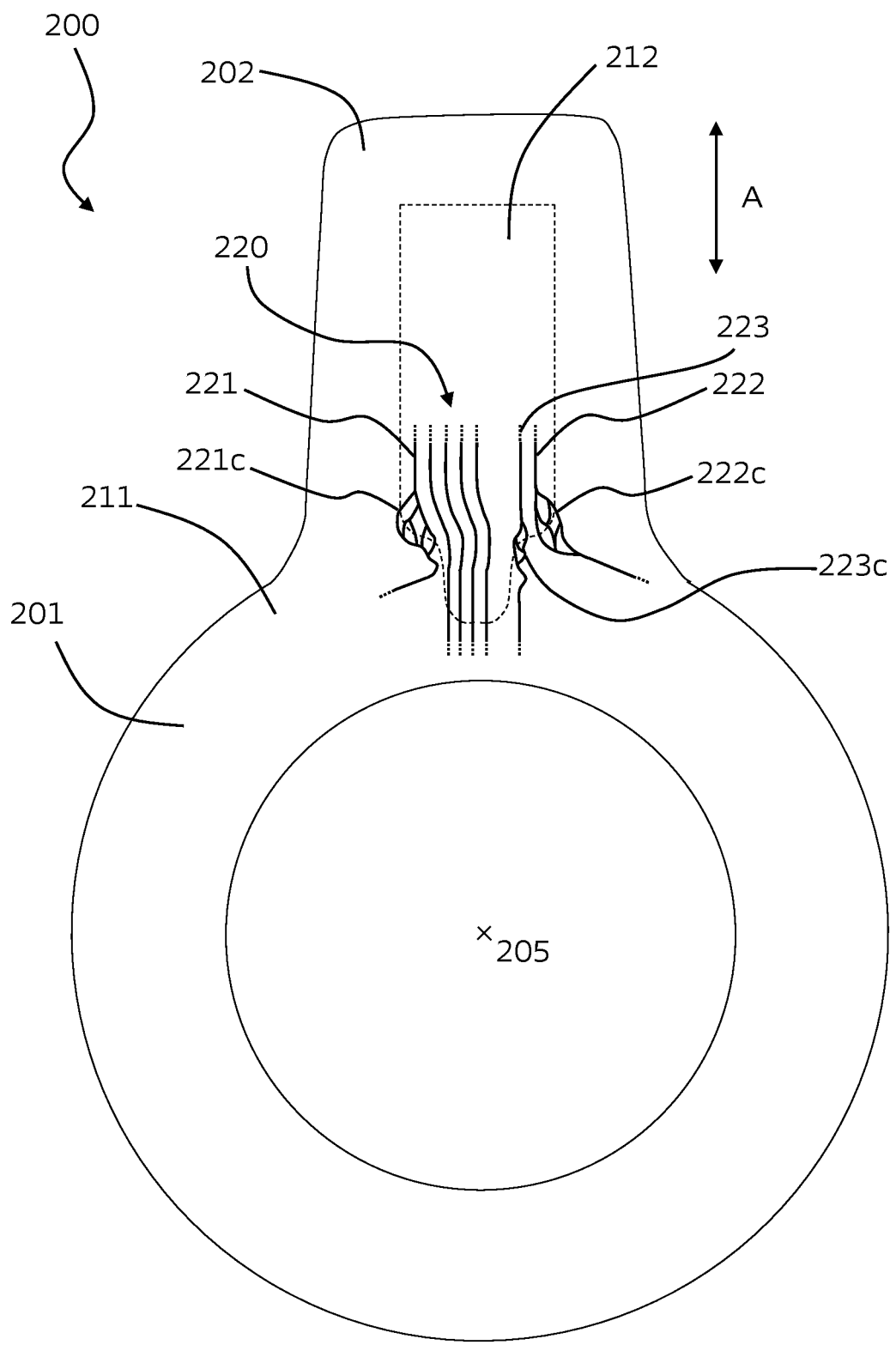
FIG. 3 illustrates a sensor patch according to an embodiment of the invention.

FIG. 3 illustrates a medical appliance being a sensor patch 200 for attachment to a proximal surface of a base plate of an ostomy appliance, according to embodiments of the invention. The sensor patch 200 comprises a stomal opening with a centre point 205. The sensor patch comprises a main portion 201, and a neck portion 202 extending in a radial direction A away from the centre point 205.

A second area 212 is highlighted by a dashed box. The second area 212 may be realised by providing a reinforcement element layered with further elements of the sensor patch 200, the reinforcement element providing the second area 212 with a second Young's modulus being greater than the first Young's modulus of the first area 211. The first area 211 surrounds the second area 212 and further spans the majority of the main portion 201. According to the illustrated embodiment, a plurality of conductive traces 220 (here, seven conductive traces) are illustrated in the vicinity of a transition from the first area 211 to the second area 212. For example, the conductive traces 220 may extend from a monitor interface (not illustrated) arranged within the second area 212 to different regions (not explicitly illustrated) of the main portion 201, such as to form sensors for detecting presence of liquid and/or moisture in/near the main portion 201. The transition between the first area 211 and the second area 212 is identified as being particularly prone to rupturing, as previously discussed. To remedy the risk of rupturing the conductive traces, the outermost conductive traces 221, 222 of the plurality of conductive traces 220 have been provided with a reinforced intermediate part 221c, 222c according to previous embodiments. Further, a third conductive trace 223, arranged next to an outermost conductive trace 222 is provided with a reinforced intermediate part 223c.

Figure 4:
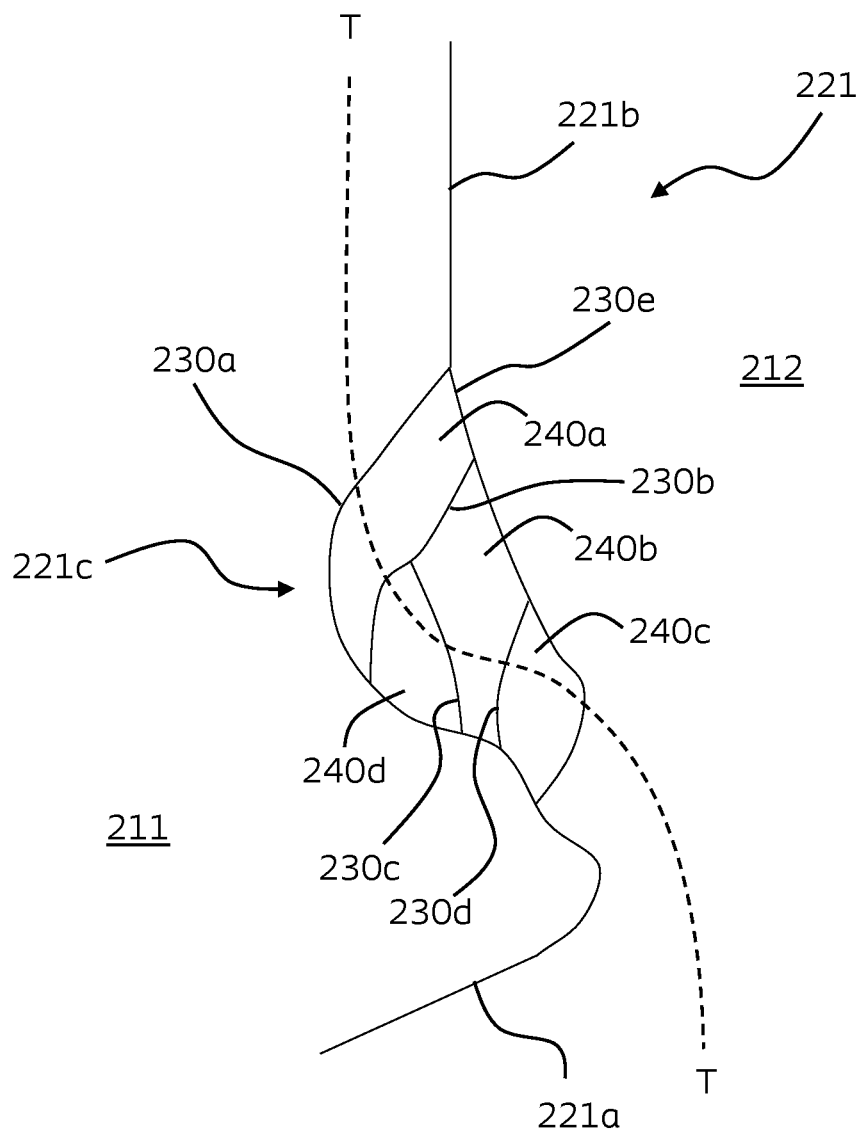
FIG. 4 illustrates a conductive trace according to embodiments of the invention.

The reinforced intermediate parts 221c, 222c, 223c of the conductive traces 221, 222, 223 comprises two or more subbranches, rather than a coherent area of greater width, as was illustrated in FIG. 1 and FIG. 2. FIG. 4 illustrates the intermediate part 221c of conductive trace 221 in greater detail. Providing an intermediate part according to the illustrated embodiment reduces the material (e.g. conductive ink) used, and further provides a more deterministic series of ruptures: the rupture of a single subbranch, e.g. as caused by a stretch, causes a discrete increase in electrical resistance, rather than a continuous increase, which may be more difficult to model in a computer model.

FIG. 4 illustrates an intermediate part 221c of a conductive trace 221 according to embodiments of the invention. A transition T between the first area 211 and the second area 212 has been drawn as a dashed line for illustrative purposes only. Each line 230a-230e represents a subbranch, and thus a possible path for a current to flow through, when going from the first part 221a to the second part 221b, and vice versa.

The conductive trace 221 comprises a first part 221a and a second part 221b, such that the intermediate part 221c is arranged between the first part 221a and the second part 221b in the appliance plane. Thereby, the conductive trace 221 is integral when going from the first part 221a to the second part 221b. The intermediate part 221c comprises a plurality of subbranches 230a, 230b, 230c, 230d, 230e whereby a plurality of non-conductive areas 240a, 240b, 240c, 240d are defined in between. In other words, the subbranches 230a-230e of the primary intermediate part 221c encircles one or more non-conductive areas 240a-240d. For example, the plurality of non-conductive areas may be characterised by the absence of conductive material, such as conductive ink forming the conductive trace, such that the non-conductive areas may be a non-conductive substrate supporting the conductive traces.

A current may flow through any of the plurality of subbranches 230a-230e from the first part 221a to the second part 221b and vice versa. According to embodiments, the combined electrical resistance of the plurality of subbranches 230a-230e is lower than the electrical resistance of the first part 221a and the electrical resistance of the second part 221b. According to embodiments, the electrical resistance of a single subbranch is substantially equal to, or lower than, the electrical resistance of the first and second parts 221a, 221b. Thereby, no increase in electrical resistance occurs in case of a rupture of all but one subbranch. Thus, in such a situation, the conductive trace 221 may still conduct a signal without interference caused by an electrical resistance in the intermediate part exceeding the electrical resistance in either of the first part 221a and the second part 221b.

The edges between the non-conductive areas 240a-240d and the subbranches 230a-230e of the primary intermediate part 221c are non-linear, meaning that the primary intermediate part 221c has an organic shape, such as resembling a capillary network of subbranches 230a-230e. In other words, the subbranches 230a-230e of the primary intermediate part 221c may form a capillary network. The organic shape, as provided by the absence of linear edges, provides for an increased stretchability: in particular, the curving subbranches comprises a built-in stretchability, such that the subbranches may be stretched at least to the point where said subbranches become linear rather than curving.

Figure 5:
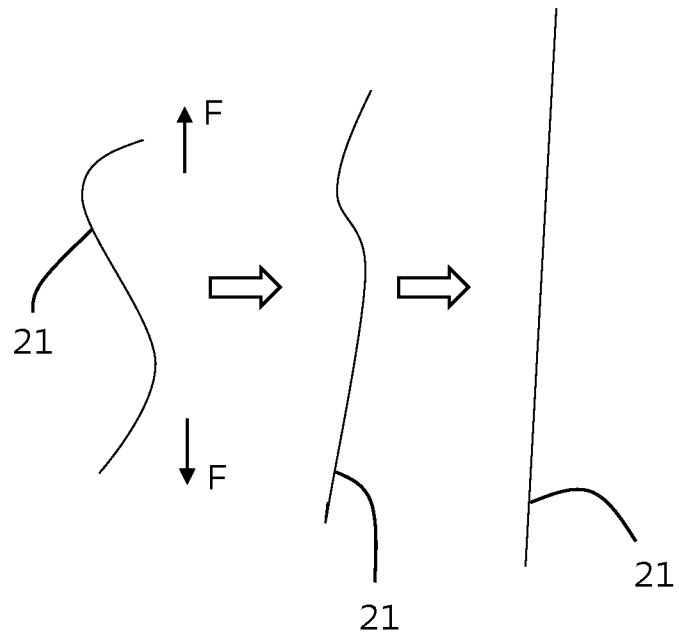
FIG. 5 illustrates a schematic of a curving subbranch according to an embodiment of the invention.

FIG. 5 illustrates a schematic of the built-in stretchability of a curving subbranch 21 (a subbranch having an organic shape as discussed in relation to FIG. 4). In particular, FIG. 5 illustrates the process of applying a stretch F (opposite directed force) to the curving subbranch 21, causing said subbranch 21 to be extended, yet maintaining its original length. Thus, the organic shape of the primary intermediate part 221c of FIG. 4 provides a built-in stretchability, further adding to the reinforced aspect of said intermediate part.

Figure 6:
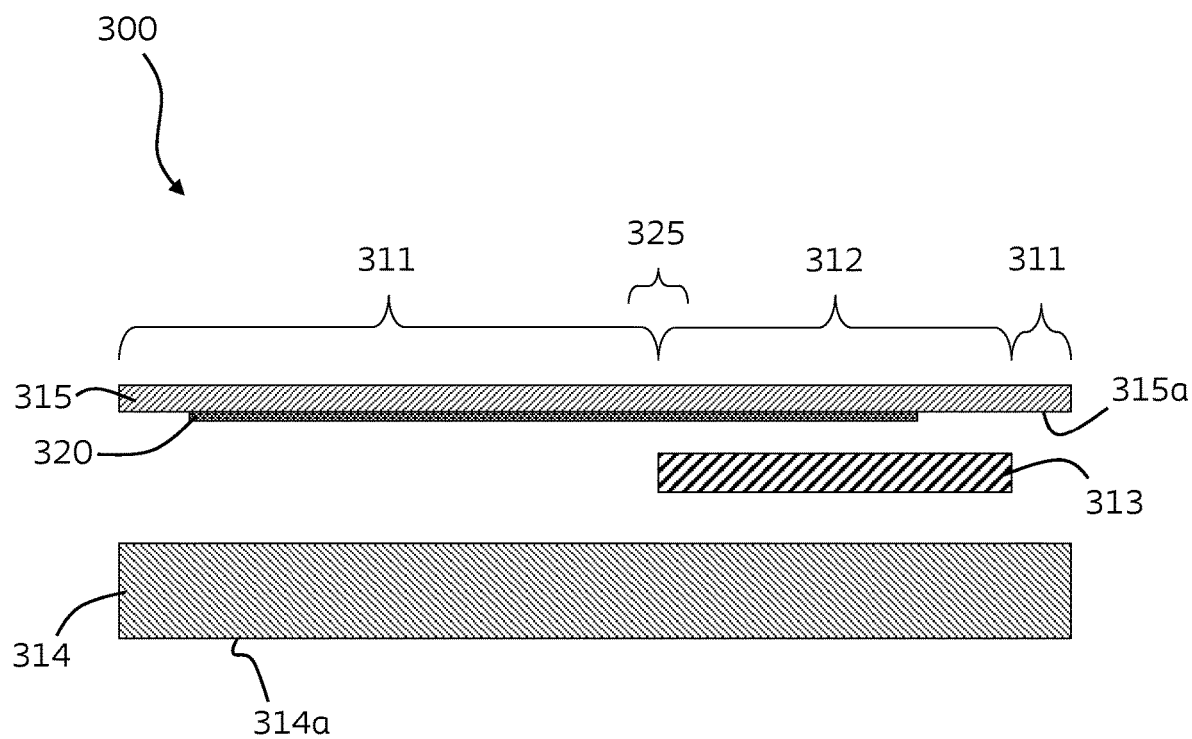
FIG. 6 illustrates a partly exploded cross-sectional view of part of a medical appliance according to an embodiment of the invention.

FIG. 6 illustrates a partly exploded cross-sectional view of part of a medical appliance 300 according to embodiments of the invention. The medical appliance 300 comprises two areas, where the second area 312 is defined by the presence of a reinforcement element 313 in the appliance plane, whereas the first area 311 is the area outside the second area 312 in the appliance plane. In addition to the reinforcement element 313, the sensor patch 300 comprises an adhesive layer 314, one or more conductive traces 320 and a support layer 315. The one or more conductive traces 320 are arranged on a proximal surface 315a of the support layer 315. The reinforcement element 313 is arranged on a proximal side of the support layer 315. The support layer 314, the conductive traces 320 and the reinforcement element 313 are arranged on a distal side of the adhesive layer 314. The adhesive layer 314 comprises a proximal surface 314a for attachment to a skin surface of a mammal.

The first area 311 has a first Young's modulus. The first Young's modulus may be a hybrid as formed from the individual Young's moduli of the materials/layers included in the first area 311, such as the support layer 315 and the adhesive layer 314 (the Young's modulus of the conductive traces may be considered negligible in the contribution to the Young's moduli). The second area 312 has a second Young's modulus being greater than the first Young's modulus. The second Young's modulus may be a hybrid as formed from the individual Young's moduli of the materials/layers included in the second area 312, such as the reinforcement element 313, the support layer 315, and the adhesive layer 314. Thereby, the presence of a reinforcement element 313 may increase the Young's modulus of the second area 312, such that said second area 312 is less stretchable than the first area 311. Thereby, the second area 312 may be considered reinforced.

In a transition 325 between the first area 311 and the second area 312, at least one of the one or more conductive traces 320 is provided with a reinforced intermediate part according to embodiments as previously discussed, see e.g. FIGS. 1-4. Thereby, the conductive traces 320 are less prone to rupturing due to a stretch applied across the transition 325 (e.g. due to a user handling the sensor patch 300).

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover all alternatives, modifications, and equivalents.

The invention claimed is:

1. A medical appliance, the medical appliance being substantially planar and extending in an appliance plane, the medical appliance comprising:
   a first area having a first Young's modulus;
   a second area having a second Young's modulus greater than the first Young's modulus; and
   one or more conductive traces extending in the appliance plane from within the first area to within the second area, the one or more conductive traces including a primary conductive trace, the primary conductive trace comprising:
      a primary first part within the first area, the primary first part having a primary first electrical resistance along the primary first part;

a primary second part within the second area, the primary second part having a primary second electrical resistance along the primary second part; and a primary intermediate part between the primary first part and the primary second part, the primary intermediate part having a primary intermediate electrical resistance along the primary intermediate part that is lower than the primary first electrical resistance and lower than the primary second electrical resistance.

2. The medical appliance according to claim 1, wherein the primary first part has a primary first width in the appliance plane, the primary second part has a primary second width in the appliance plane, the primary intermediate part has a primary intermediate width, wherein the primary intermediate width is greater than the primary first width and greater than the primary second width.

3. The medical appliance according to claim 1, wherein the primary intermediate part in the appliance plane encircles one or more primary non-conductive areas having a lower electrical conductivity than the primary intermediate part.

4. The medical appliance according to claim 3, wherein edges between the one or more primary non-conductive areas and the primary intermediate part are non-linear.

5. The medical appliance according to claim 3, wherein the primary intermediate part comprises a plurality of primary subbranches encircling the one or more primary non-conductive areas.

6. The medical appliance according to claim 5, wherein each of the plurality of primary subbranches has a primary subbranch electrical resistance, and wherein the primary subbranch electrical resistance is lower than or equal to the primary first electrical resistance and lower than or equal to the primary second electrical resistance.

7. The medical appliance according to claim 1, comprising a support layer and wherein the one or more conductive traces are provided on a proximal side of the support layer.

8. The medical appliance according to claim 7, comprising a reinforcement element extending throughout the second area of the medical appliance.

9. The medical appliance according to claim 7, wherein at least the primary second part of the primary conductive trace is provided between the support layer and the reinforcement element.

10. The medical appliance according to claim 7, comprising an adhesive layer, and wherein the one or more conductive traces is provided between the support layer and the adhesive layer.

11. The medical appliance according to claim 10, comprising an insulative masking layer comprising one or more openings, and wherein the one or more conductive traces is provided between the support layer and the masking layer.

12. The medical appliance according to claim 11, wherein the masking layer is provided between the support layer and the adhesive layer.

13. The medical appliance according to claim 8, wherein a Young's modulus of the reinforcement element is greater than a Young's modulus of the support layer.

14. The medical appliance according to claim 1, wherein the one or more conductive traces includes a secondary conductive trace, the secondary conductive trace comprising:

a secondary first part within the first area, the secondary first part having a secondary first electrical resistance along the secondary first part;

a secondary second part within the second area, the secondary second part having a secondary second electrical resistance along the secondary second part; and a secondary intermediate part between the secondary first part and the secondary second part, the secondary intermediate part having a secondary intermediate electrical resistance along the secondary intermediate part that is lower than the secondary first electrical resistance and lower than the secondary second electrical resistance.

15. The medical appliance according to claim 14, wherein the one or more conductive traces includes a tertiary conductive trace, the tertiary conductive trace comprising:

a tertiary first part within the first area, the tertiary first part having a tertiary first electrical resistance along the tertiary first part;

a tertiary second part within the second area, the tertiary second part having a tertiary second electrical resistance along the tertiary second part; and a tertiary intermediate part between the tertiary first part and the tertiary second part, the tertiary intermediate part having a tertiary intermediate electrical resistance along the tertiary intermediate part that is substantially the same as the tertiary first electrical resistance and/or the tertiary second electrical resistance.

16. The medical appliance according to claim 15, wherein the tertiary intermediate part is arranged between the primary intermediate part and the secondary intermediate part in the appliance plane.

17. The medical appliance according to claim 1, wherein the medical appliance is a sensor patch for an ostomy appliance, wherein the medical appliance is configured to be layered with an adhesive layer of the ostomy appliance.

18. The medical appliance according to claim 1, wherein the medical appliance is a base plate for an ostomy appliance with a proximal side configured for attachment of the base plate to the skin surface of a user.

19. A method of manufacturing a medical appliance, the method comprising:

providing a support layer extending in an appliance plane; and printing one or more conductive traces on the support layer from within a first area to within a second area, such that the one or more conductive traces includes a primary conductive trace, comprising:

a primary first part within the first area, the primary first part having a primary first electrical resistance along the primary first part;

a primary second part within the second area, the primary second part having a primary second electrical resistance along the primary second part; and a primary intermediate part between the primary first part and the primary second part, the primary intermediate part having a primary intermediate electrical resistance along the primary intermediate part that is lower than the primary first electrical resistance and lower than the primary second electrical resistance.

20. The method according to claim 19 comprising applying a reinforcement element to extend throughout the second area, and such that at least the primary second part of the primary conductive trace is provided between the support layer and the reinforcement element.

* * * * *